United States Patent
Salter et al.

(10) Patent No.: US 11,133,800 B2
(45) Date of Patent: Sep. 28, 2021

(54) VEHICLE FLOOR ASSEMBLY HAVING CAPACITIVE PROXIMITY SENSOR

(71) Applicant: Ford Global Technologies, LLC, Dearborn, MI (US)

(72) Inventors: Stuart C. Salter, White Lake, MI (US); Pietro Buttolo, Dearborn Heights, MI (US); Vivien J. Martinage, Grosse Pointe Farms, MI (US); Christian Lange, Ferndale, MI (US); Michael Contino, Northville, MI (US); Nir Siegel, Raananna (IL)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/837,197

(22) Filed: Apr. 1, 2020

(65) Prior Publication Data

US 2021/0152176 A1    May 20, 2021

Related U.S. Application Data

(63) Continuation-in-part of application No. 16/689,596, filed on Nov. 20, 2019.

(51) Int. Cl.
| | |
|---|---|
| *H03K 17/955* | (2006.01) |
| *H03K 17/96* | (2006.01) |
| *B60W 50/10* | (2012.01) |
| *B62D 25/20* | (2006.01) |

(52) U.S. Cl.
CPC ........... *H03K 17/955* (2013.01); *B60W 50/10* (2013.01); *B62D 25/20* (2013.01); *H03K 17/962* (2013.01); *B60W 2420/24* (2013.01); *B60W 2422/00* (2013.01); *H03K 2217/960755* (2013.01)

(58) Field of Classification Search
CPC ............... H03K 17/955; H03K 17/962; H03K 2217/960755; B60W 2420/24
See application file for complete search history.

(56) References Cited

U.S. PATENT DOCUMENTS

| 4,796,013 | A  * | 1/1989 | Yasuda | G01V 3/088 |
| | | | | 180/272 |
| 8,397,853 | B2 * | 3/2013 | Stefani | B60L 15/20 |
| | | | | 180/68.5 |
| 8,933,708 | B2 | 1/2015 | Buttolo et al. | |
| 9,568,527 | B2 | 2/2017 | Buttolo et al. | |
| 2004/0080486 | A1* | 4/2004 | Troxell | G06F 3/0443 |
| | | | | 345/156 |
| 2009/0225036 | A1* | 9/2009 | Wright | G06F 3/0443 |
| | | | | 345/173 |
| 2014/0210239 | A1 | 7/2014 | Yetukuri et al. | |
| 2014/0265477 | A1 | 9/2014 | Yetukuri et al. | |

(Continued)

FOREIGN PATENT DOCUMENTS

DE    102014117823 A1    6/2016

*Primary Examiner* — Dominic E Hawkins
(74) *Attorney, Agent, or Firm* — David Coppiellie; Price Heneveld LLP

(57) ABSTRACT

A vehicle floor assembly includes a floor structure and a capacitive proximity sensor assembly configured to detect a user touch command and a user pressure command. The floor assembly further includes a controller for receiving the user touch command and pressure command and controlling a vehicle related operation based on the detected user input commands.

18 Claims, 14 Drawing Sheets

(56) References Cited

U.S. PATENT DOCUMENTS

| | | | |
|---|---|---|---|
| 2015/0177298 A1* | 6/2015 | Sugiura | G01B 7/003 |
| | | | 324/658 |
| 2017/0120757 A1* | 5/2017 | Lewis | B60L 53/12 |
| 2017/0129367 A1* | 5/2017 | Hein | B60N 2/0244 |
| 2018/0062649 A1 | 3/2018 | Salter et al. | |
| 2018/0099608 A1* | 4/2018 | Salter | G05G 1/44 |
| 2019/0003876 A1* | 1/2019 | Aina | G01V 9/00 |
| 2019/0036527 A1* | 1/2019 | Dolcetti | B60N 2/002 |
| 2019/0047584 A1* | 2/2019 | Donnelly | B60W 50/085 |
| 2020/0218378 A1* | 7/2020 | Takai | G06F 3/03547 |

* cited by examiner

VEHICLE FLOOR ASSEMBLY HAVING CAPACITIVE PROXIMITY SENSOR

CROSS-REFERENCE TO RELATED APPLICATION

This application is a continuation-in-part of U.S. patent application Ser. No. 16/689,596 filed Nov. 20, 2019, entitled "CAPACITIVE PROXIMITY SENSOR ASSEMBLY HAVING MULTIPLE SENSING CONFIGURATIONS." The aforementioned related application is hereby incorporated by reference.

FIELD OF THE DISCLOSURE

The present invention generally relates to a vehicle floor assembly, and more particularly relates to a floor assembly having a sensor arrangement configured to control one or more vehicle related operations.

BACKGROUND OF THE DISCLOSURE

Automotive vehicles have various inputs for controlling vehicle related operations. With automated vehicles, enhanced user inputs are desired. Vehicles typically have a floor assembly which may include a carpet and a floor mat placed thereon upon which passengers of the vehicle may position their feet. It may be desirable to provide for enhanced user inputs and controls associated with the floor assembly.

SUMMARY OF THE DISCLOSURE

According to a first aspect of the present invention, a vehicle floor assembly is provided. The vehicle floor assembly includes a floor structure, a capacitive proximity sensor assembly provided on the floor structure, and a controller for controlling one or more vehicle related operations based on a user input sensed with the capacitive proximity sensor assembly.

Embodiments of the first aspect of the invention can include any one or a combination of the following features:
- the floor structure comprises a floor mat configured to be located on a floor of a vehicle, and wherein the capacitive proximity sensor assembly is located on the floor mat;
- the capacitive proximity sensor assembly comprises a plurality of capacitive proximity sensors located in an array;
- the array of capacitive proximity sensors are configured to detect a gesture movement command;
- the vehicle seating assembly comprises a first capacitive proximity sensor and a second capacitive proximity sensor, wherein the first and second proximity sensors are located proximate one another;
- the capacitive proximity sensor includes a first electrode, a second electrode, and a compliant dielectric layer disposed between the first and second electrodes, wherein the controller processes signals associated with the first and second electrodes and selectively reconfigures operation of the first and second electrodes and different proximity sensor arrangements to provide a first capacitive sensor configured to sense touch and a second capacitive sensor configured to sense pressure;
- the first electrode comprises a pair of electrodes that are configurable to generate a mutual capacitance to provide a first capacitance sensor and are further configurable to generate a self-capacitance to provide a second capacitive sensor;
- the pair of electrodes comprises a first plurality of capacitive fingers and a second plurality of capacitive fingers, wherein the first plurality of capacitive fingers are interdigitated with the second plurality of capacitive fingers;
- the first and second electrodes provide a third capacitive sensor configured to sense proximity of an object; and
- the controller sequentially samples signals associated with each of the first, second and third capacitive sensors.

According to a second aspect of the present invention, a vehicle floor assembly is provided. The vehicle floor assembly includes a floor structure, a capacitive proximity sensor assembly provided on the floor structure and configured to detect a user touch input command and a user pressure input command, and a controller for receiving the user touch command and pressure command and controlling a vehicle related operation based on the detected input commands.

Embodiments of the second aspect of the invention can include any one or a combination of the following features:
- the floor structure comprises a floor mat configured to be located on a floor of a vehicle, and wherein the capacitive proximity sensor assembly is located on the floor mat;
- the capacitive proximity sensor assembly comprises a plurality of capacitive proximity sensors located in an array;
- the array of capacitive proximity sensors are configured to detect a gesture movement command;
- the vehicle seating assembly comprises a first capacitive proximity sensor and a second capacitive proximity sensor, wherein the first and second proximity sensors are located proximate one another;
- the capacitive proximity sensor includes a first electrode, a second electrode, and a compliant dielectric layer disposed between the first and second electrodes, wherein the controller processes signals associated with the first and second electrodes and selectively reconfigures operation of the first and second electrodes and different proximity sensor arrangements to provide a first capacitive sensor configured to sense touch and a second capacitive sensor configured to sense pressure;
- the first electrode comprises a pair of electrodes that are configurable to generate a mutual capacitance to provide a first capacitance sensor and are further configurable to generate a self-capacitance to provide a second capacitive sensor;
- the pair of electrodes comprises a first plurality of capacitive fingers and a second plurality of capacitive fingers, wherein the first plurality of capacitive fingers are interdigitated with the second plurality of capacitive fingers; and
- the controller sequentially samples signals associated with each of the first, second and third capacitive sensors.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
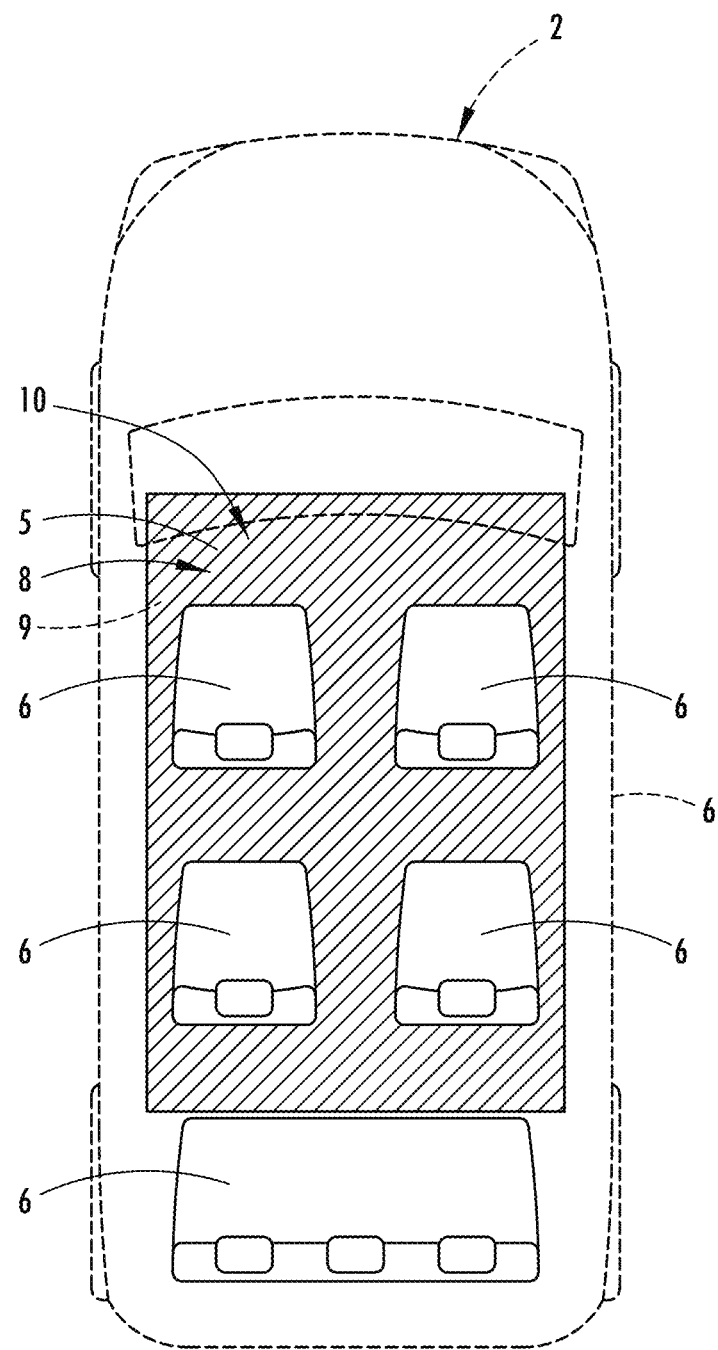
FIG. 1 is a top view of a passenger compartment of a motor vehicle having a floor structure with a capacitive proximity sensor assembly, according to one embodiment.

For purposes of description herein, the terms "upper," "lower," "right," "left," "rear," "front," "vertical," "horizontal," and derivatives thereof shall relate to the concepts as oriented in FIG. 1. However, it is to be understood that the concepts may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The present illustrated embodiments reside primarily in combinations of method steps and apparatus components related to a vehicle floor assembly. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

Referring now to FIG. 1, a motor vehicle 2 is generally illustrated having a body 4 containing a passenger compartment equipped with a one or more seating assemblies 6. The motor vehicle 2 may be a wheeled motor vehicle such as a car, van, truck, sport utility vehicle (SUV), bus or any other vehicle for transporting one or more passengers. In the example shown, there are three rows of seating assemblies 6. The first front row of seating assemblies may include a driver side seating assembly positioned rearward of a steering wheel and a passenger side seating assembly laterally offset from the driver side seating assembly. The second and third rows of seating assemblies 6 may include two or three seating assemblies positioned rearward of the front row of seating assemblies. It should be appreciated that vehicle 2 may be a driver controlled vehicle, a semi-autonomous vehicle or an autonomous vehicle and may be equipped with any number of seating assemblies arranged in various seating configurations.

The vehicle 2 has a vehicle floor assembly 8 which includes a floor structure 9 generally extending along the bottom of the passenger compartment. The floor structure 9 may support the seating assemblies 6 and provides a floor upon which users or passengers may place their feet and other items. The floor structure 9 may include a supporting structure and an overlaying floor cover 5 such as a carpet and/or one or more floor mats. The vehicle floor assembly 8 has a capacitive proximity sensor assembly provided therein for sensing the feet of one or more users and generating signals that are processed to determine one or more input commands. The capacitive proximity sensor assembly 10 may be located in the floor cover 5 such as in a carpet or one or more floor mats.

Figure 2A:
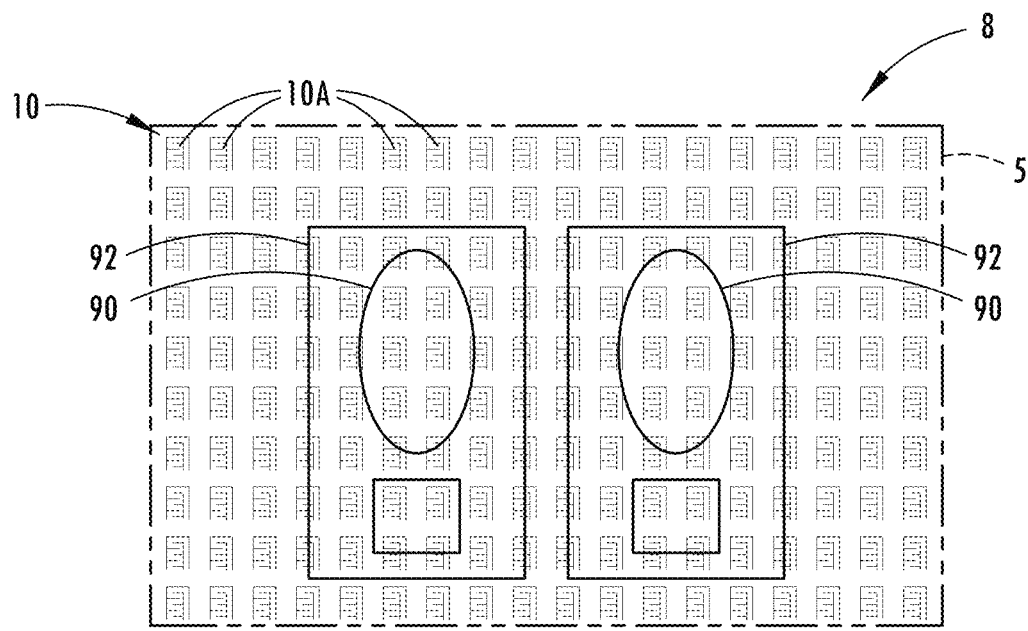
FIG. 2A is an enlarged top view of a portion of the floor assembly forward of a front driver's seat and having the capacitive proximity sensor assembly with an array of sensors for detecting feet of a user, according to one embodiment.
Figure 2B:
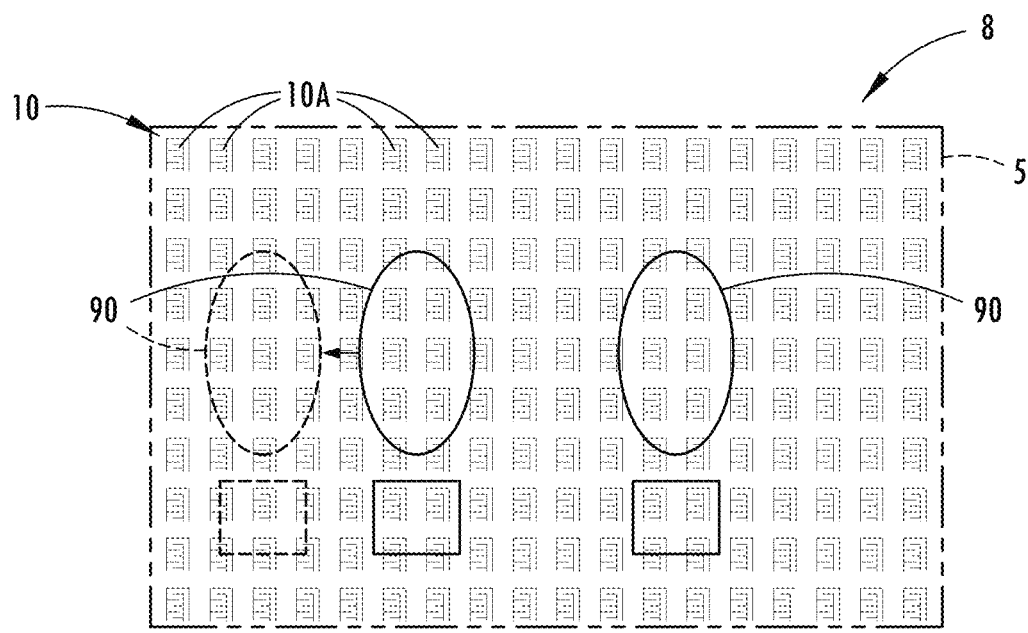
FIG. 2B is an enlarged top view of the portion of the floor assembly of FIG. 2A further illustrating a sliding gesture command input by the user's feet, according to one example.

The capacitive proximity sensor assembly 10 senses the presence of objects such as one or more feet of a user, such as a driver or passenger, seated in one or more of the seating assemblies 6 and generates signals that are processed to determine one or more user input commands. For example, input user commands such as a touch, a sliding motion for a gesture and pressure applied by one or both feet can be determined to be input commands to control one or more vehicle related functions. Referring to FIG. 2A, a portion of the capacitive proximity sensor assembly 10 is shown having a plurality of capacitive proximity sensors 10A arranged in an array of rows and columns. First and second feet 90 of a user, such as a passenger or driver of the vehicle, are shown as sensed objects within sensed regions 92. Each sensed region 92 detects each foot 90 with the use of a plurality of capacitive proximity sensors 10A. In the example shown in FIG. 2A, the presence of a pair of feet 92 are detected. If the user taps one or both feet on the floor covering 5, that may signal an input command such as an input signal to request control of a user interface such as a touchscreen menu selection. If movement of the user's foot is detected, the signal could be indicative of a gesture request to move a cursor on the touchscreen. For the driver, a sliding gesture movement of one foot could be detected and determined to be a request for the vehicle to pass another vehicle travelling on the roadway as shown with the sliding motion of the foot in FIG. 2B. This may be particularly advantageous for use with an autonomous or semi-autonomous vehicle. The capacitive proximity sensor assembly 10 further is able to detect a pressure applied onto the floor covering 5 by the feet of the user. A pressure applied input may be indicative of a driver instructing the vehicle to stop which may also be advantageous for use with an autonomous or semi-autonomous vehicle.

Figure 3:
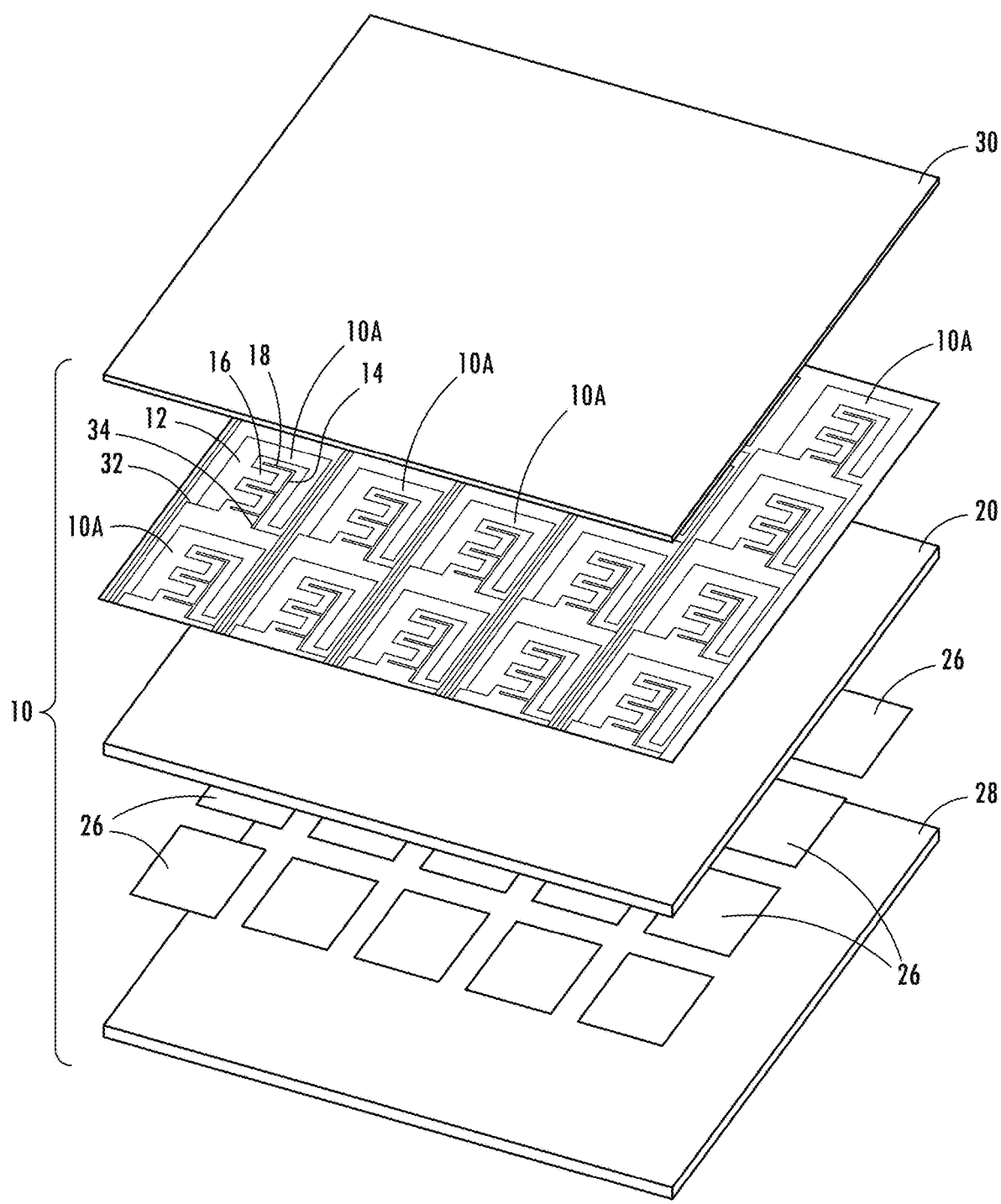
FIG. 3 is an exploded upper front perspective view of the capacitive proximity sensor assembly, according to a first embodiment.

Referring now to FIG. 3, a proximity sensor assembly in the form of a capacitive sensor assembly 10 is illustrated, according to a first embodiment. The capacitive proximity sensor assembly 10 includes a plurality of capacitive sensors 10A each having a pair of first and second electrodes 12 and 14 having respective first and second conductive fingers 16 and 18 configurable in one operating mode to produce mutual capacitance to form a mutual capacitance sensor. Each capacitive sensor 10A also includes a third electrode 26 and a compliant dielectric layer 20 disposed between the pair of first and second electrodes 12 and 14 and the third electrode 26. The capacitive proximity sensor assembly 10 further includes a controller 40 selectively sampling signals from each of the first, second and third electrodes and sequentially reconfiguring the operational sensor mode of the electrodes in different proximity sensor operating arrangements or modes to provide a plurality of capacitive sensors that may operate as mutual or self-capacitive sensors.

The capacitive proximity sensor assembly 10, according to the first embodiment shown in FIG. 3, includes three electrodes configured to operate in different sensor modes or states by using a controller to reconfigure the input and output sampling of the signals generated by the various electrodes to operate in different sensor configurations to provide up to three capacitive sensors that may operate as a mutual capacitive sensor or a self-capacitive sensor and to sense input commands, such as touch, proximity, sliding gestures and pressure or force.

The arrangement of the electrodes in the capacitive proximity sensor assembly 10 is illustrated in FIG. 3 having the first and second capacitive electrodes 12 and 14 of each capacitive sensor 10A arranged within a common plane or layer and dielectrically isolated from one another via a separation distance. The first electrode 12 has a first plurality of conductive fingers 16 and the second electrode 14 has a second plurality of conductive fingers 18. The first plurality of conductive fingers 16 are interdigitated or interleaved with the second plurality of conductive fingers 18. As a result, the first and second electrodes 12 and 14 may operate in a first mode as a mutual capacitance sensor when one of the electrode signal terminals 32 and 34 is driven with a drive signal and the other of the electrode signal terminals 32 and 34 generates a receive signal when operated in a mutual capacitance mode. When one of the electrode signal terminals 32 and 34 receives a drive signal, that electrode operates as a drive electrode and the other electrode operates as a receive electrode. The drive electrode may receive square wave drive pulses applied at a voltage $V_I$. The receive electrode may have an output for generating an output voltage $V_O$. It should be appreciated that the first and second electrodes 12 and 14 may be arranged in various other configurations for generating a capacitive electric field as an activation field.

In the mutual capacitance sensor mode, the drive electrode is applied with voltage input $V_I$ as square wave pulses having a charge pulse cycle sufficient to charge the receive electrode to a desired voltage. The receive electrode thereby serves as a measurement electrode. When a user or operator, such as a user's foot, enters the activation electric field generally proximate the top front side of the proximity sensor assembly 10, each capacitive sensor 10A proximate thereto detects the disturbance caused by the foot to the activation electric field and determines whether the disturbance is sufficient to detect an object such as a close proximity or touch input sufficient to activate a proximity switch or generate a desired output. The disturbance of the activation electric field is detected by processing the charge pulse signal associated with the corresponding signal. The foot of a user has conductive properties that interact with the electric field of the capacitive sensors such that the presence of the foot can be detected. The sensitivity of the capacitive sensors may be selected to allow for detection of the foot under various conditions such as when the foot is covered by a shoe or boot which typically has a dielectric material.

An overlying dielectric cover 30 is provided on the top front side of the capacitive sensors 10A covering the first and second electrodes 12 and 14 to provide dielectric isolation and protection of the first and second electrodes 12 and 14. The dielectric cover 30 may include any dielectric materials, such as a dielectric polymer or plastic, rubber, a carpet layer, a trim component or other dielectric medium. It should be appreciated that the first and second electrodes 12 and 14 may be formed by printing conductive ink in the desired patterns of the electrodes. The ink may be printed on the rear surface of the dielectric cover 30, according to one embodiment or may be printed on the front surface of the dielectric layer 20 therebelow. The first and second electrodes 12 and 14 may otherwise be formed by placing preformed conductive electrodes between the dielectric cover 30 and the compliant dielectric layer 20.

Disposed below the first and second electrodes 12 and 14 of the capacitive sensors 10A is the compliant dielectric layer 20. The compliant dielectric layer 20 has a relatively soft material that is compliant and deformable when pressure, which is force applied over an area, is applied to the front of the cover 30 so as to squeeze and deform the first compliant dielectric layer 20. According to one example, the compliant dielectric layer 20 may be a soft foam material.

Located below the compliant dielectric layer 30 is a third electrode 26. The third electrode 26 is shown formed as a sheet of conductive material, according to one embodiment. The third electrode 26 has a signal terminal 38 to allow for communication of signals with the controller. The third electrode 26 may operate in one sensor mode as a mutual capacitive sensor that detects pressure applied to the top front surface which causes deformation of the compliant dielectric layer 20. As the compliant dielectric layer 20 is squeezed due to pressure and deforms, at least a portion of the pair of the first and second electrodes 12 and 14, which may be shorted together to form a single electrode or operated individually, moves towards the third electrode 26. When this occurs, the controller detects the relative position of the pair of first and second electrodes 12 and 14 relative to the third electrode 26. In other sensor modes, the third electrode 26 may be open-circuited to operate as a shield for the first and second electrodes 12 and 14 located thereabove or the third electrode 26 located therebelow. When operated as a shield, the third electrode 26 may be open-circuited such that there is no applied voltage applied or may be driven to a desired voltage, according to various embodiments.

A further bottom dielectric layer 28 is shown provided below the third electrode 26 so as to dielectrically isolate the third electrode 26 on the bottom side. In one embodiment, the bottom dielectric 28 may be a dielectric backing material.

Figure 5:
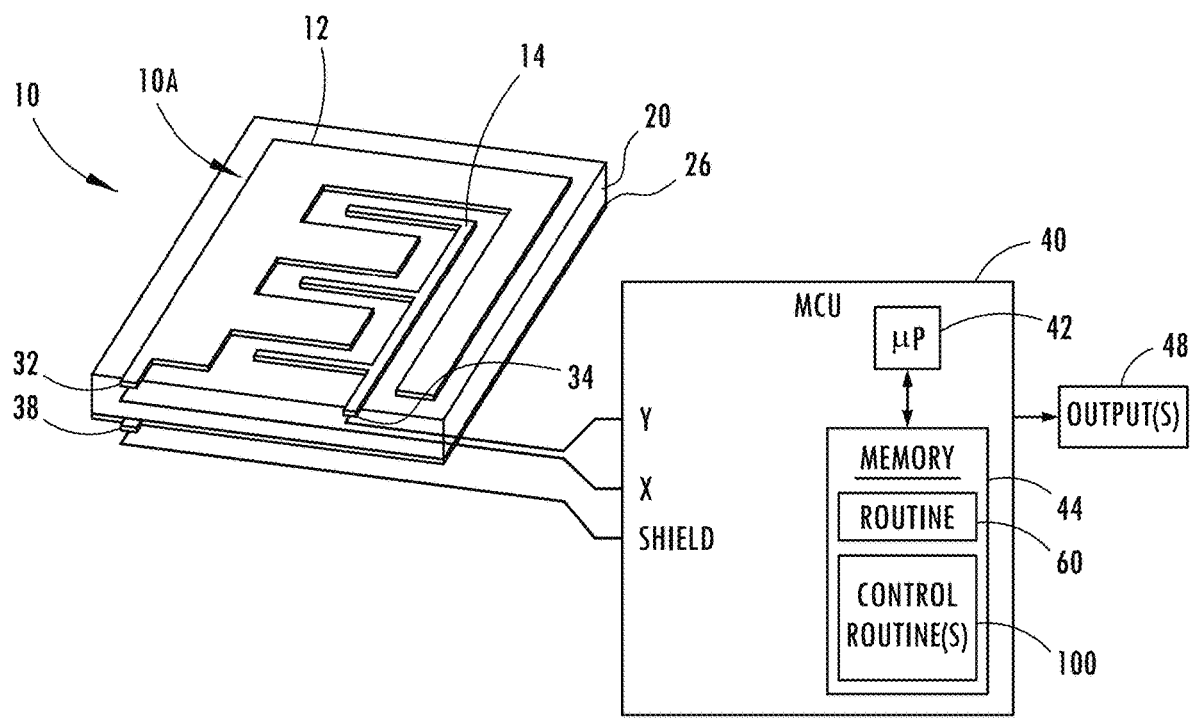
FIG. 5 is a front perspective view of the single sensor portion of the capacitive proximity sensor assembly shown in FIG. 4 with the controller configured to sample signals in a first sensor mode.
Figure 6:
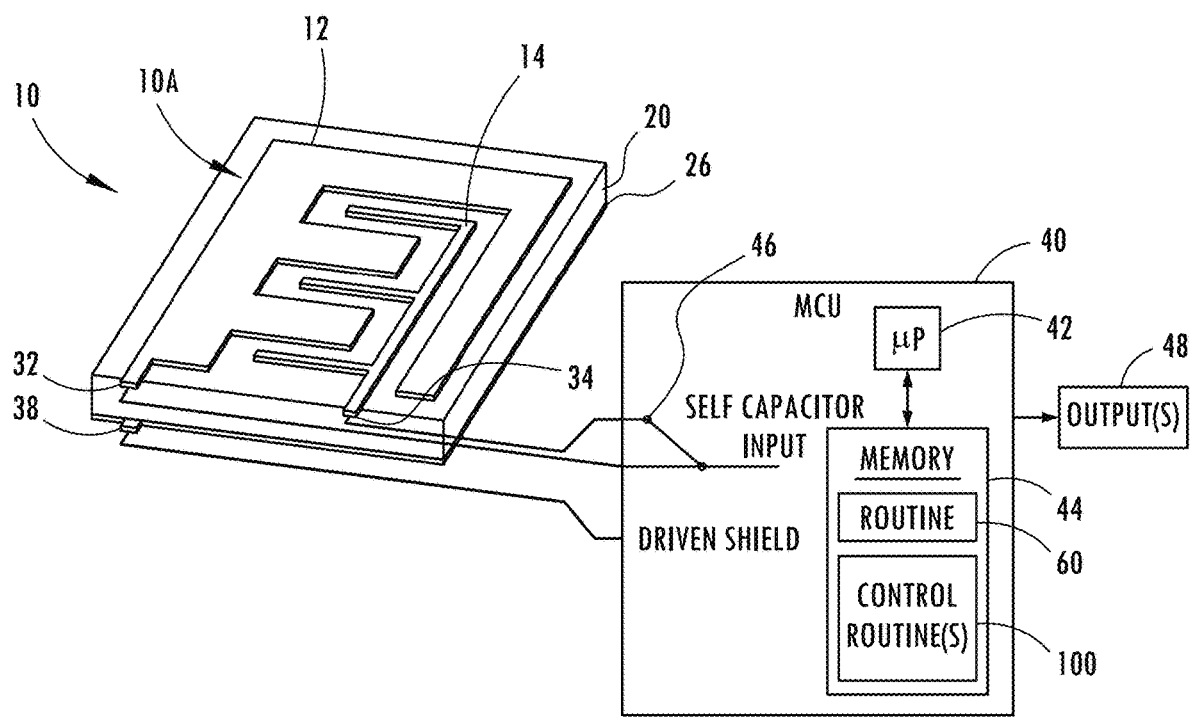
FIG. 6 is a front perspective view of the single sensor portion of the capacitive proximity sensor assembly shown in FIG. 4 with the controller configured to sample signals in a second sensor mode.
Figure 7:
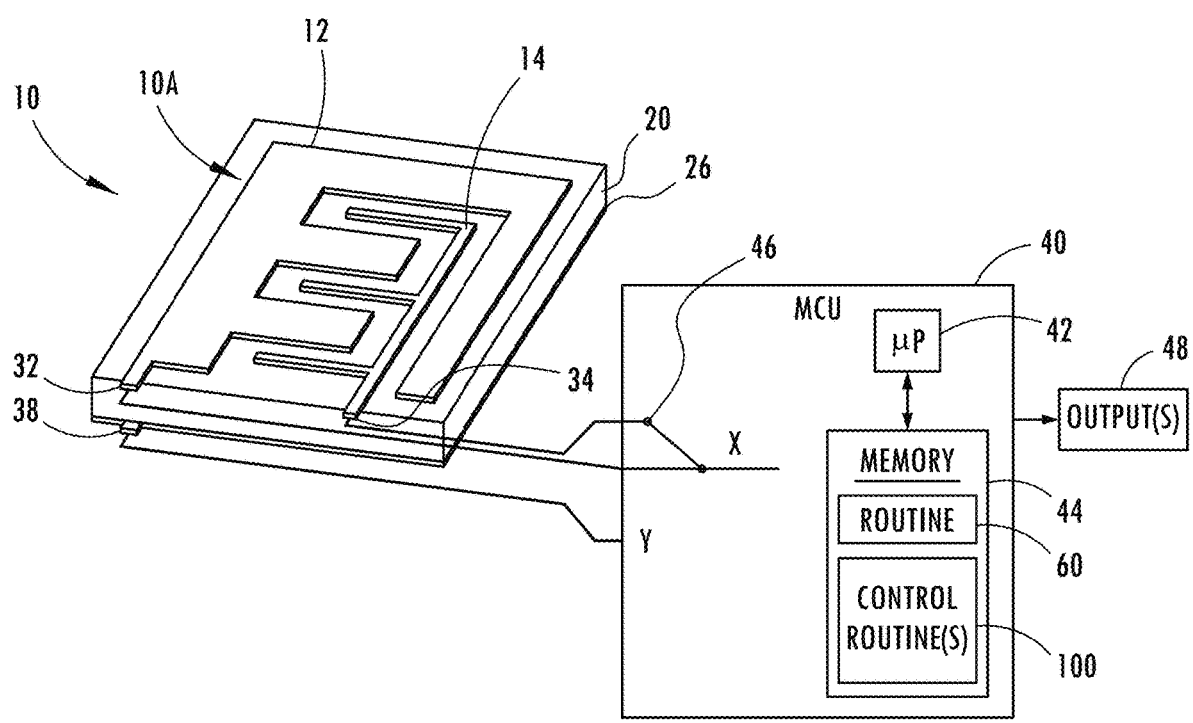
FIG. 7 is a front perspective view of the single sensor portion of the capacitive proximity sensor assembly shown in FIG. 4 with the controller configured to sample signals in a third sensor mode.

Referring to FIGS. 4-10, the various operating sensor modes of the electrode configurations as controlled by a controller 40 are illustrated for the first embodiment of the capacitive proximity sensor assembly 10 shown in FIG. 3. As best seen in FIGS. 5-7, the controller 40 may include a microprocessor 42 and memory 44 configured with one or more routines 100. The controller 40 may be a micro control unit (MCU) having firmware, according to one example. It should be appreciated that other analog and/or digital circuitry may be used to provide the controller 40. The controller 40 includes various inputs/outputs including three inputs/outputs connected to the respective signal terminals 32, 34 and 38 associated with the first, second and third electrodes 12, 14 and 26. Additionally, the controller 40 may generate one or more outputs 48 based on the sensed signals. For example, the controller 40 may provide proximity switch outputs based on the proximity sensing such that the capacitive proximity sensor assembly 10 operates as one or more capacitive proximity switches, according to various examples.

Figure 8:
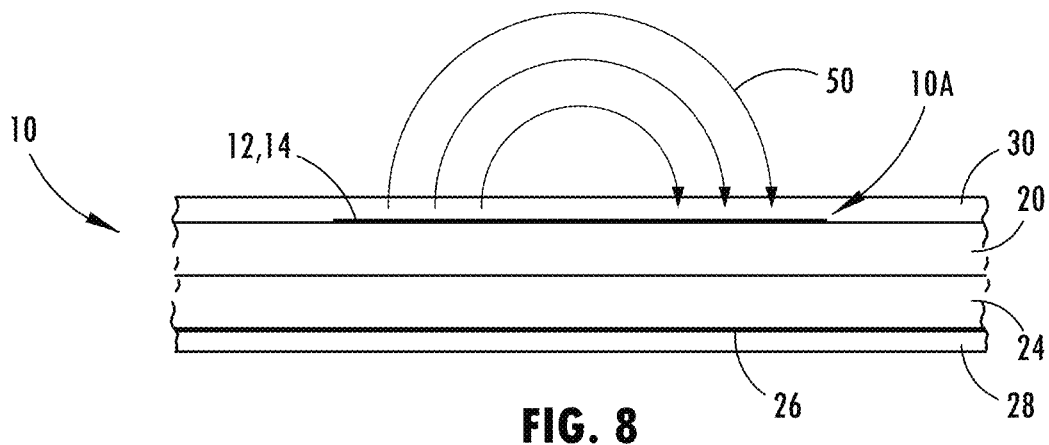
FIG. 8 is a cross-sectional view of the single sensor portion of the capacitive proximity assembly of FIG. 4 further illustrating the electric field generated in the first sensor mode.

Referring to FIGS. 5 and 8, the proximity sensor assembly 10 is configured according to a first sensor mode in which the first and second electrodes 12 and 14 form a mutual capacitance with each other to serve as a first sensor that may be used to sense touch or close proximity of a user at or near the top front surface of cover 30. In this sensor mode, the third electrode 26 is open-circuited via the controller 40 so as to form a conductive shield that may enhance the mutual capacitance between the first electrode 12 and second electrode 14. The first electrode 12 may receive a drive signal X and the second electrode 14 may supply a receive signal Y. As seen in FIG. 8, the activation electric field is generated due to a mutual capacitive coupling of the first and second electrodes 12 and 14 as illustrated by arrows 50 to enable the detection of touch or movement, e.g., swipe, on or above the front cover 30 (e.g., within 30 millimeters).

Figure 9:
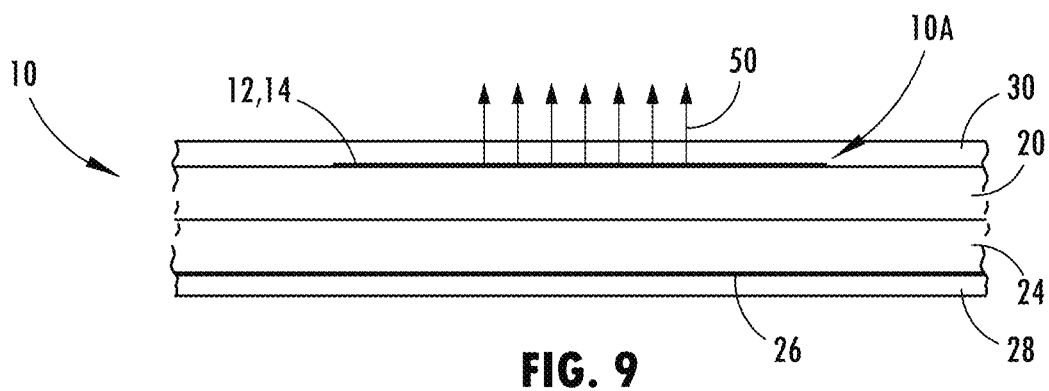
FIG. 9 is a cross-sectional view of the single sensor portion of the capacitive proximity sensor assembly of FIG. 4 further illustrating the electric field generated in the second sensor mode.

The controller 40 may sequentially switch the capacitive proximity sensor assembly 10 amongst the various sensor modes at a rapid speed simply by changing the inputs and outputs and thereby reconfiguring the sensing arrangement to sequentially provide first, second and third sensors. Referring to FIGS. 6 and 9, the capacitive proximity sensor assembly 10 is shown in the second sensor mode in which the first and second electrodes 12 and 14 are electrically shorted together to form a single electrode, and the third electrode 26 is driven to a desired voltage to provide a shield. To electrically short the first and second electrodes 12 and 14 together, the controller 40 may include a switch 46 that may be implemented in firmware or otherwise implemented with an analog or digital switch. In this sensor mode, the first and second electrodes 12 and 14 which are shorted together receives a self-capacitor input to generate an activation electric field illustrated by arrows 50 to form a self-capacitive second sensor as seen in FIG. 9 in which the activation electric signal may detect objects above the top front cover 30 at an extended distance (e.g., a distance up to 30 centimeters). The self-capacitor input may apply a voltage for half of a cycle to charge the electrode and may sense capacitance during the other half of the cycle.

Figure 10:
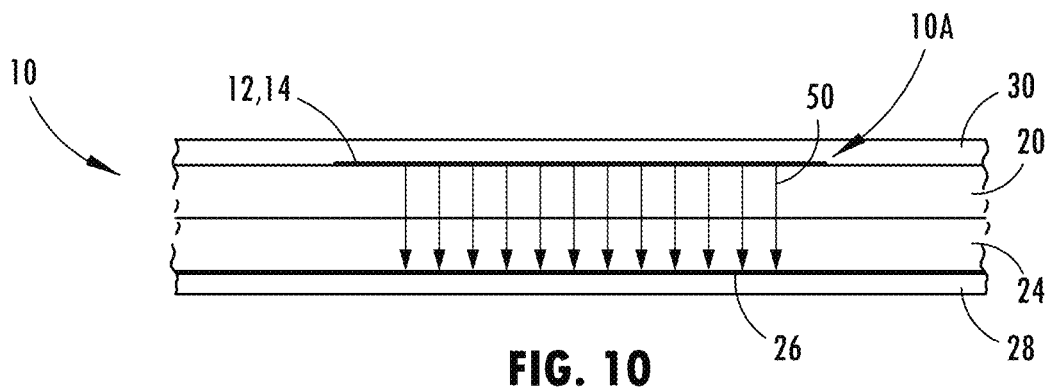
FIG. 10 is a cross-sectional view of the single sensor portion of the capacitive proximity sensor assembly of FIG. 4 further illustrating the electric field generated in the third sensor mode.

Referring to FIGS. 7 and 10, the capacitive proximity sensor assembly 10 is illustrated in the third sensor mode in which the first and second electrodes 12 and 14 are electrically shorted together via the switch 46 as controlled by controller 40 and receive the drive signal X, and the third electrode 26 supplies the receive signal Y. It should be appreciated that the short-circuited first and second electrodes 12 and 14 may receive the drive signal X to form a mutual capacitance with the third electrode 26 to provide a third sensor. As such, movement of the shorted together first and second electrodes 12 and 14 relative to third electrode due to compression of the first compliant dielectric layer 20 may be detected as an indication of the amount of force or pressure applied to the front surface of the cover 30 on the cover layer 5. The activation electric field between the shorted-circuited first and second electrodes 12 and 14 and the third electrode 26 is illustrated by arrows 50 in FIG. 10.

Figure 16:
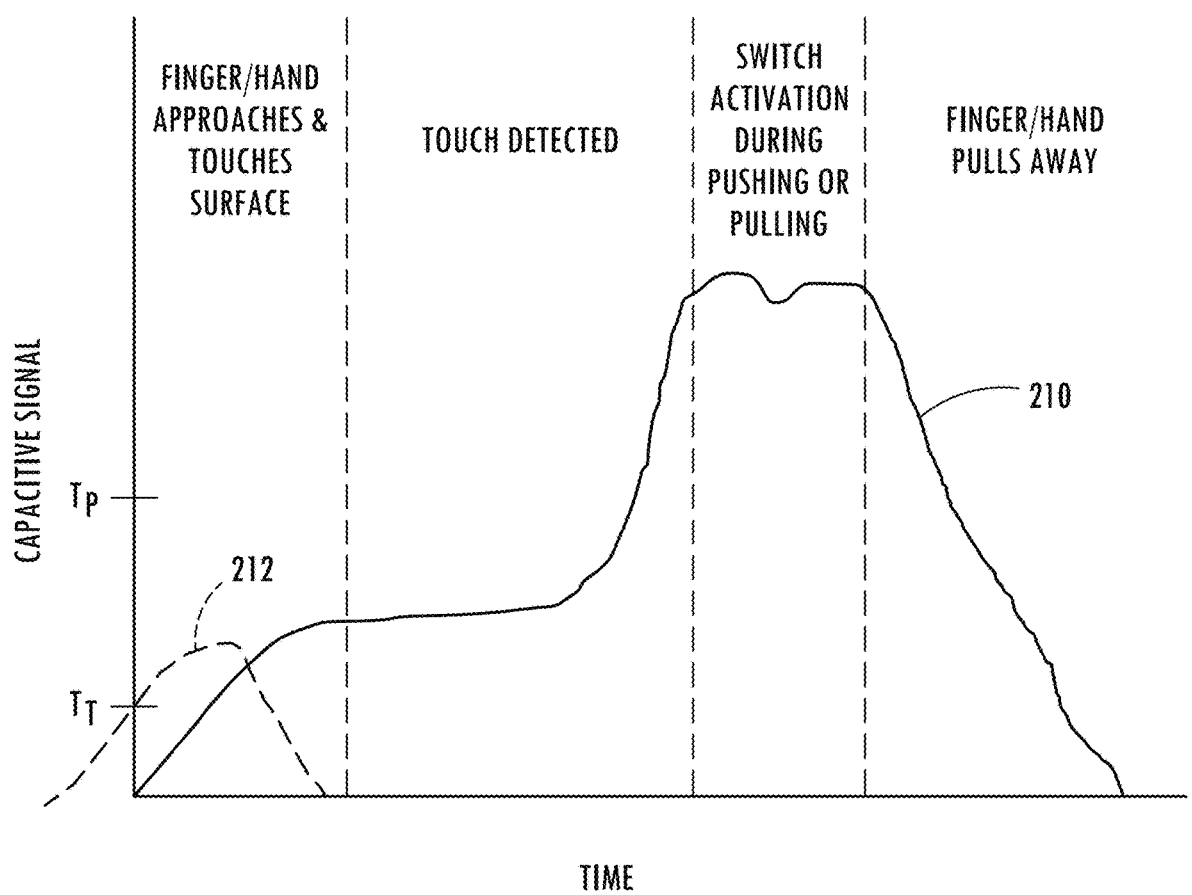
FIG. 16 is a graph illustrating one example of the sensor signals processed during touch, sliding and press input actuations.

One example of a sensed user foot movement is illustrated in FIG. 16. As seen, signal 210 is generated by a capacitive proximity sensor as a user's foot approaches the capacitive proximity sensor assembly, performs a touch command followed by a pressure command and subsequently removes the foot from the capacitive proximity assembly. As such, the signal 210 initially rises up above a touch threshold $T_T$ where a touch command can be detected. When a touch command is detected, a first output such as seated occupant detection may be determined. The signal 210 then is shown rising up above a second threshold $T_P$ indicative of a pressure command whereby the user presses on the assembly to activate a second command, such as to instruct the vehicle to brake or to select a user interface menu item. This may occur by a user pushing on the floor assembly containing the capacitive sensor assembly. Thereafter, the foot moves away from the assembly and the signal 210 drops below the threshold. In addition, a second signal 212 is illustrated for the embodiment where there are two sensors located side-by-side or one above the other. The second signal 212 is generated by second sensor when the foot approaches and crosses over the first sensor and drop back down as the foot slides beyond the second sensor. As such, a direction of user input can be detected by detecting the second signal 212 followed by the first signal 210 so as to determine the direction from which the user's foot approaches the sensor assembly and to determine a swiping gesture command.

Accordingly, it should be appreciated that the controller 40 may sequentially switch between the first, second and third sensor modes as illustrated in FIGS. 3 and 4-10 at a rapid pace so as to sequentially configure the capacitive proximity sensor assembly 10 in various sensor configurations referred to as first, second and third sensors and sample sensed signals to sense a sensed condition in each sensor mode. This may be achieved by the controller 40 switching the drive signal X and the receive signal Y between the various inputs and outputs and sampling the signals over a short period of time such as 20 milliseconds and then switching sequentially to the next sensor mode, repeatedly. As such, multiple sensors may be realized with the capacitive proximity sensor assembly 10. The sensor signals may be compared to threshold values to act as switches to trigger an output response.

Figure 11:
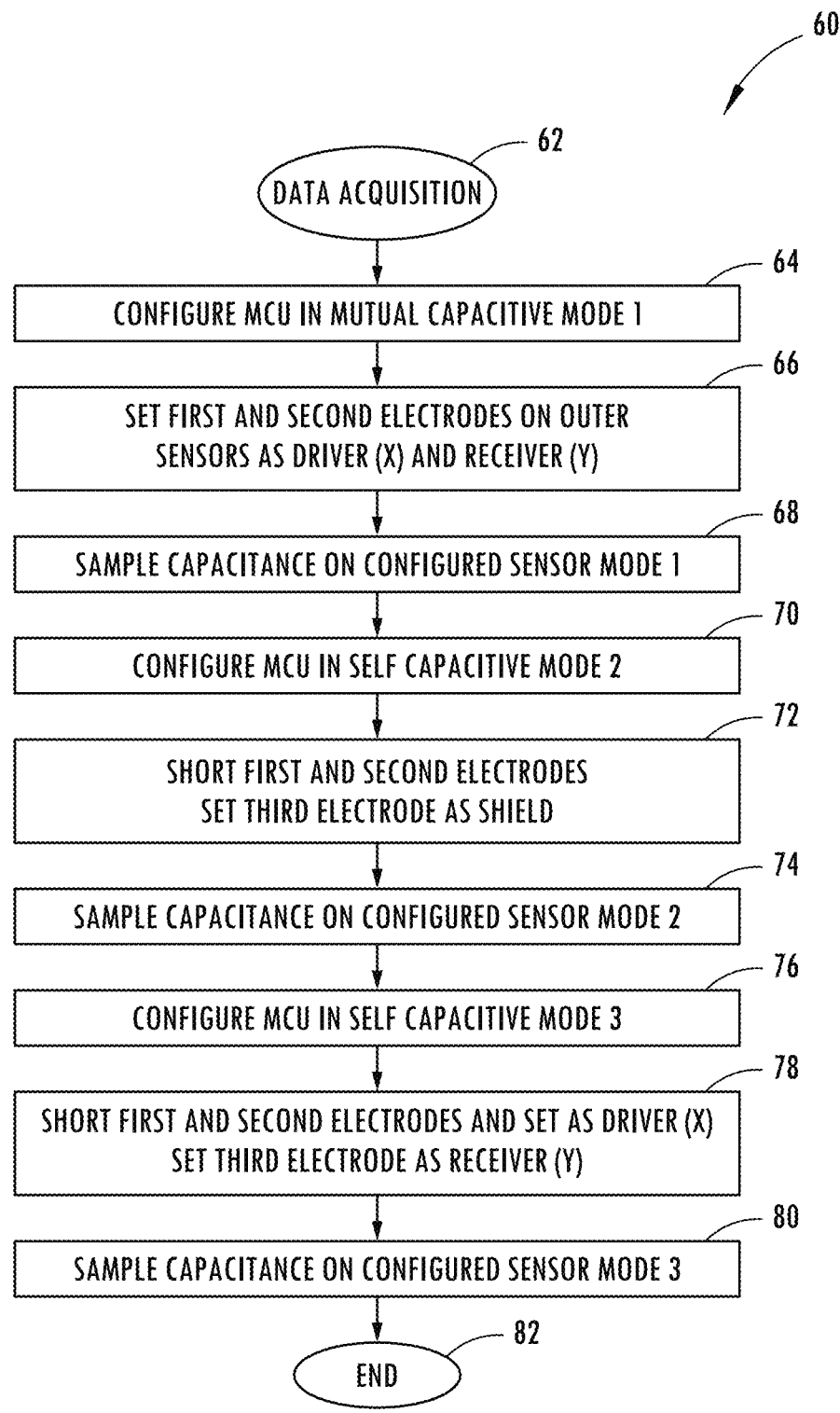
FIG. 11 is a flow diagram illustrating a routine for sampling and measuring signals generated by each sensor of the capacitive proximity sensor assembly of FIG. 3 in the first, second and third sensor modes.

Referring to FIG. 11, a routine 60 for controlling the controller 40 to sequentially switch the capacitive proximity sensor assembly 10 amongst the various operating modes is illustrated, according to one embodiment. The routine 60 is shown for operating the capacitive proximity sensor assembly 10 according to the first embodiment in each of sensor modes 1-3. It should be appreciated that the routine 60 may be executed by the microprocessor 42 in the controller 40 and that the routine 60 may be stored in memory 44. The routine 60 may sample data and reconfigure the capacitive proximity sensor assembly 10 in the various modes at a sampling rate of about 20 milliseconds, according to one example. It should be appreciated that other sampling rates may be employed.

Routine 60 begins at step 62 to acquire data and then proceeds to step 64 to configure the controller in a first mutual capacitance sensor mode 1. In sensor mode 1, routine 60 proceeds to step 66 to set the first electrode with the drive signal X and to set the second electrode with the drive receive signal Y, and may set the third electrode as a shield. Thereafter, routine 60 proceeds to step 68 to sample the capacitance on the configured mutual capacitance sensor in sensor mode 1. Sensor mode 1 may sense touch commands which may be used to perform a function such as displaying information and activating certain devices such as lighting devices.

Next, routine 60 proceeds to step 70 to configure the controller in a self-capacitance sensor mode 2. In mode 2, routine 60 proceeds to step 72 to electrically short-circuit the first and second electrodes together, and to set the third electrode as a shield. The shorted together first and second electrodes receive a self-capacitance input signal. Next, at step 74, routine 60 samples the capacitance of the configured self-capacitance sensor in sensor mode 2. Sensor mode 2 may be used to determine detection of an object proximate to the sensor.

Next, routine 60 proceeds to step 76 to configure the controller in a mutual capacitance sensor mode 3. This includes electrically short-circuiting the first and second electrodes together and setting the combined first and second electrodes with the drive signal X, and setting the third electrode with the receive signal Y in step 78. Next, in step 80, the capacitance of the configured mutual capacitance sensor in sensor mode 3 is sampled before ending at step 82. Sensor mode 3 may detect pressure applied to the floor covering and may be used to command braking of the vehicle or selection of a user interface menu item.

It should be appreciated that the routine 60 may be repeated sequentially at a rapid pace, such that the sampling between the execution of the sensor configurations in modes 1, 2 and 3 may occur at a sampling rate of 20 milliseconds, for example. As a result, the capacitive proximity sensor assembly 10 is able to operate sequentially in multiple modes with different configurations of capacitive sensors to sense various signals, particularly objects and input commands in four sensor modes pursuant to the first embodiment.

Figure 12:
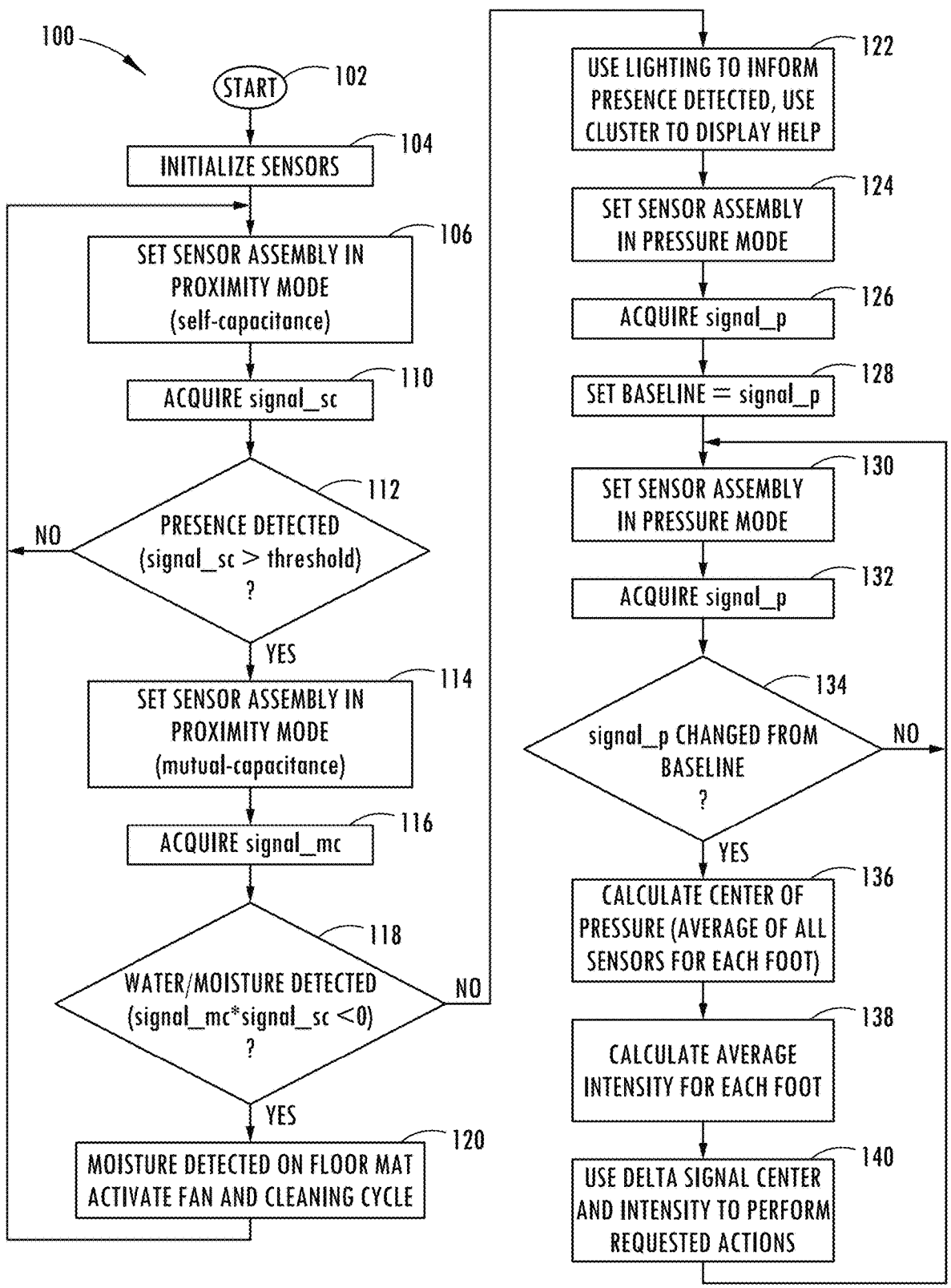
FIG. 12 is a flow diagram illustrating a routine for controlling the vehicle functions with the capacitive proximity sensor assembly of FIG. 3.
Figure 13:
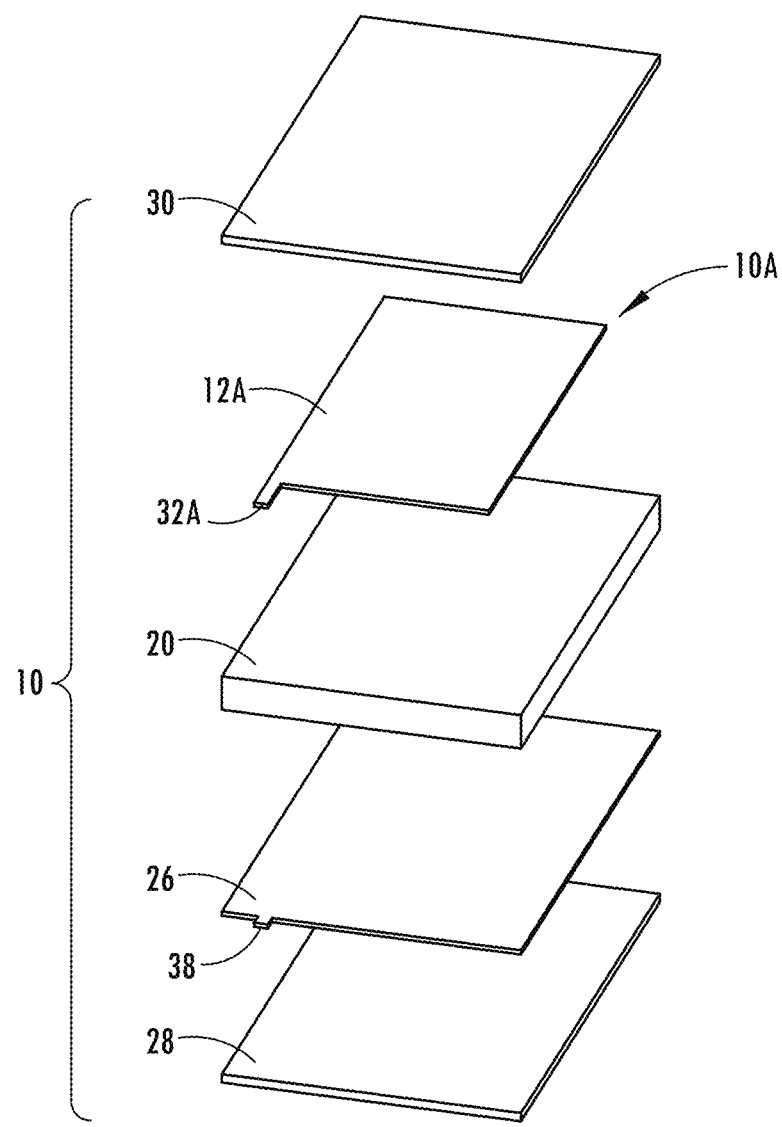
FIG. 13 is an exploded front perspective view of a single sensor portion of the capacitive proximity sensor assembly shown in FIG. 3B, according to the third embodiment.

Referring to FIG. 12, a routine 100 for controlling the switching of the capacitive proximity sensor assembly 10 amongst the various operating modes and controlling vehicle functions with the controller is shown, according to one embodiment. Routine 100 begins at step 102 and proceeds to step 104 to initialize the capacitive sensors. It should be appreciated that routine 100 may perform an initialization and calibration for each sensor mode once at startup.

Following initialization of the sensors, the routine 100 sets the sensor assembly in a proximity sensing mode using the self-capacitance mode at step 106. Next, at step 110 routine 100 acquires the sensed signal_sc while in the self-capacitance mode. At decision step 112, routine 100 determines if the presence of an object, such as a user's foot, is detected by determining whether the sensed signal_sc is greater than a threshold. If an object is detected, routine 100 proceeds to step 112. If no object is detected, routine 100 returns to step 106.

Proceeding to step 114, routine 100 sets the sensor assembly in the proximity mode which senses mutual capacitance and then acquires a signal_mc at step 116. Next, at decision step 118, routine 100 determines whether water/moisture is detected. The detection of water/moisture can be detected when the signal_mc multiplied by signal_sc is less than zero, i.e., is negative, for example. The capacitive sensor assembly is able to detect the presence of water/moisture based on the sensed signals and whether the sensor assembly is operating in a mutual capacitance mode or a self-capacitance mode. The water/moisture interferes with the electric field and is thereby detectable. If water/moisture is detected, routine 100 proceeds to activate one or more fans in an attempt to evaporate and remove the water/moisture and a cleaning cycle at step 120 before returning to step 106 and sets a baseline equal to signal_p at step 128.

Provided there is no water/moisture detected, routine 100 proceeds to step 122 to use lighting to inform that the presence of an object is detected and may use the vehicle cluster to display help. At step 124, routine 124 sets the sensor assembly in the pressure mode, and then acquires signal_p at step 126 and sets a baseline equal to signal_p at step 128. Once the baseline is set, routine 100 sets the sensor assembly in the pressure mode at step 130 and acquires signal_p at step 132. At decision step 134, routine 100 determines if signal_p has changed from the baseline and, if no, returns to step 130. If signal_p has changed from the baseline, then routine 100 proceeds to calculate the center of the pressure at step 136. The center of the applied pressure may be calculated based on an average value for each sensed foot. The average intensity for each sensed foot is then sensed in step 138. Finally, routine 100 uses the delta signal center and intensity to perform one or more commanded actions to perform a vehicle related function such as to brake the vehicle or activate a user menu selection, for example, at step 140 before returning to step 130.

Figure 3A:
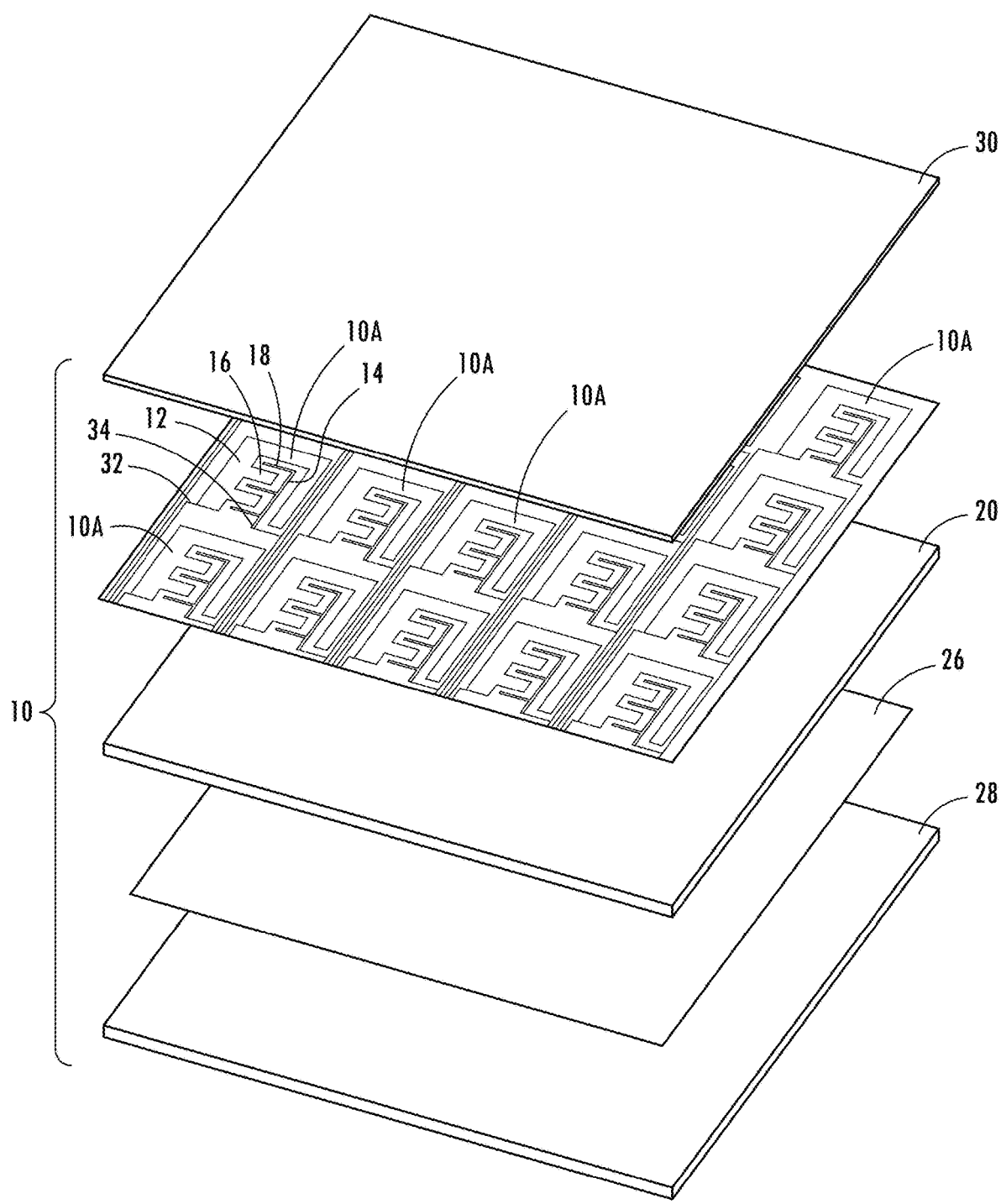
FIG. 3A is an exploded upper front perspective view of a capacitive proximity sensor assembly, according to a second embodiment.

Referring to FIG. 3A, the capacitive proximity sensor assembly 10 is shown in a second embodiment having a single conductive layer 26 as opposed to a plurality of conductive pads. In this embodiment, the single conductive layer 26 provides a common signal on a single electrode that may generate an electric field with each of the first and second electrodes. The capacitive proximity sensor assembly shown in the second embodiment may operate similar for to the first embodiment.

Figure 3B:
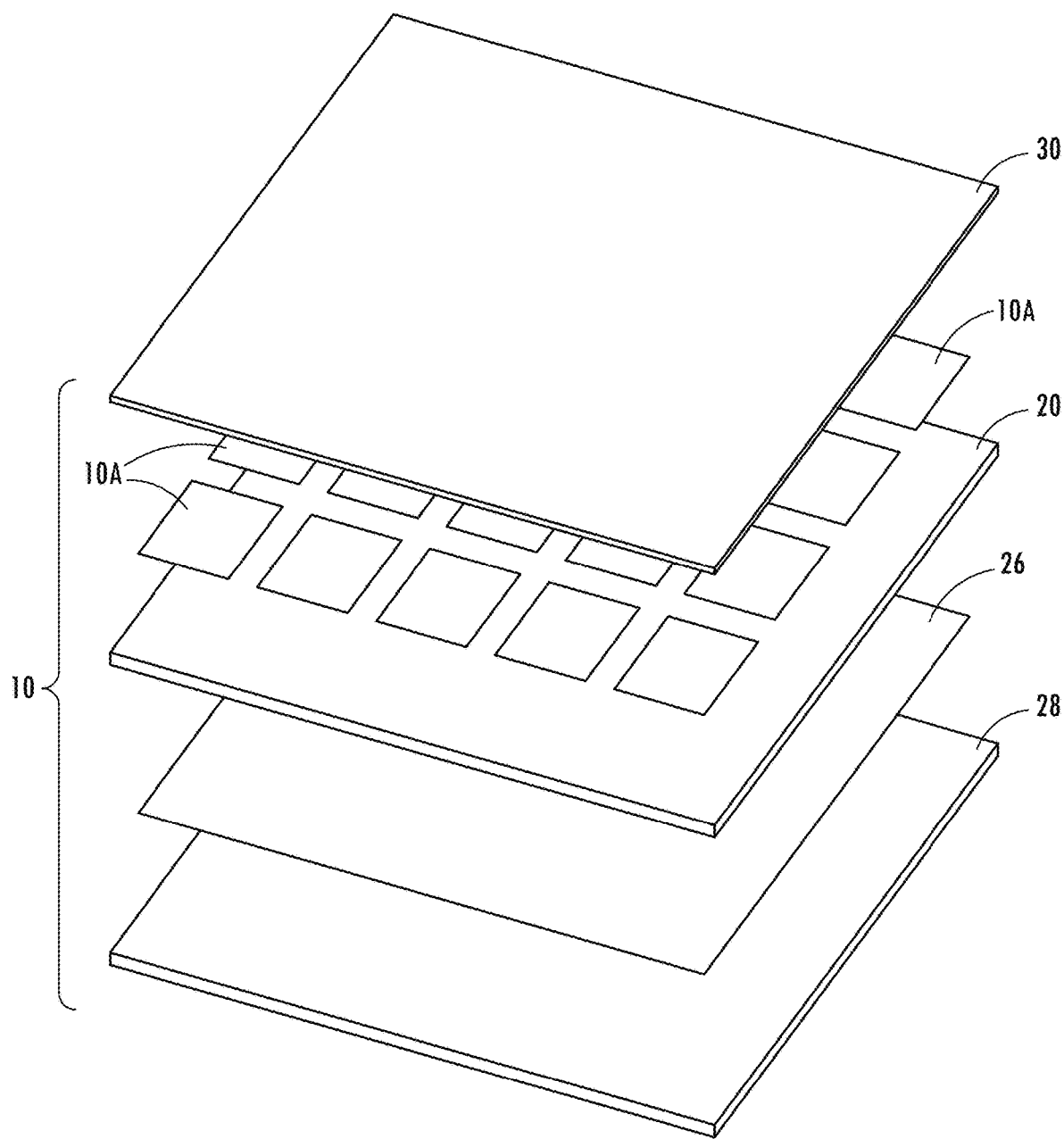
FIG. 3B is an exploded upper front perspective view of a capacitive proximity sensor assembly, according to a third embodiment.
Figure 4:
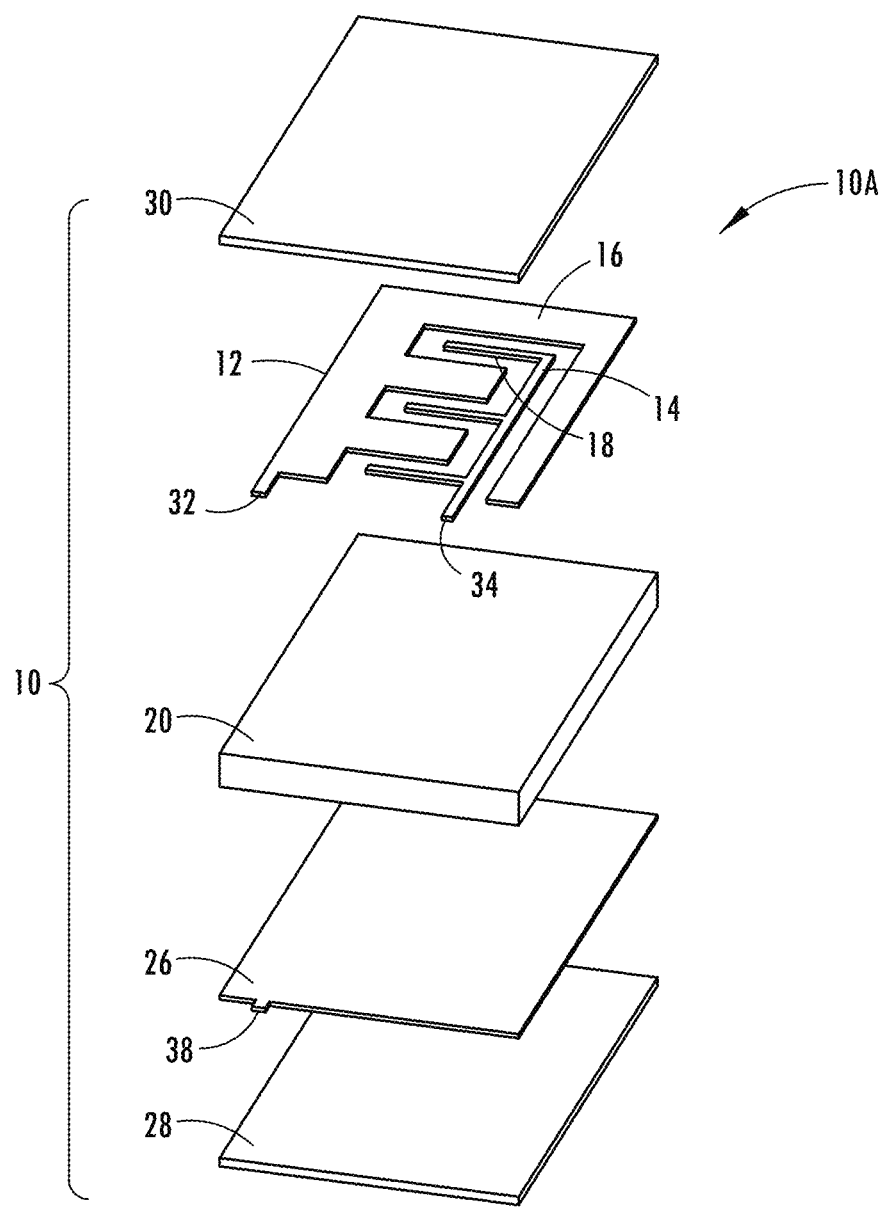
FIG. 4 is an exploded upper front perspective view of a single sensor portion of the capacitive sensor assembly shown in FIG. 3, according to the first embodiment.

Further, referring to FIG. 3B, the capacitive sensor assembly 10 is shown in a third embodiment having a plurality of conductive pads used in place of the first and second electrodes for each sensor and a single conductive sheet 26. In this embodiment, each of the conductive pads associated with each sensor operates as a first electrode and the single conductive sheet 26 operates as a second electrode for each sensor.

Figure 14:
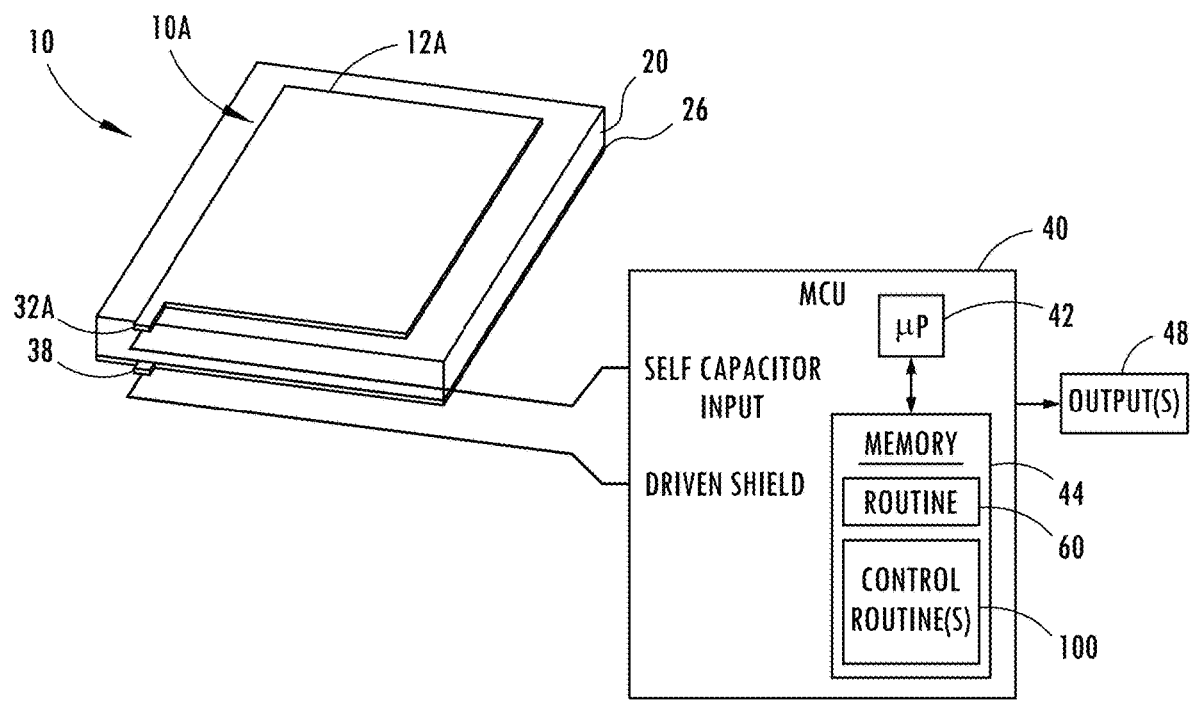
FIG. 14 is a front perspective view of the single sensor portion of the capacitive proximity sensor assembly shown in FIG. 13 and controlled by a controller to sample signals in a first sensor mode.
Figure 15:
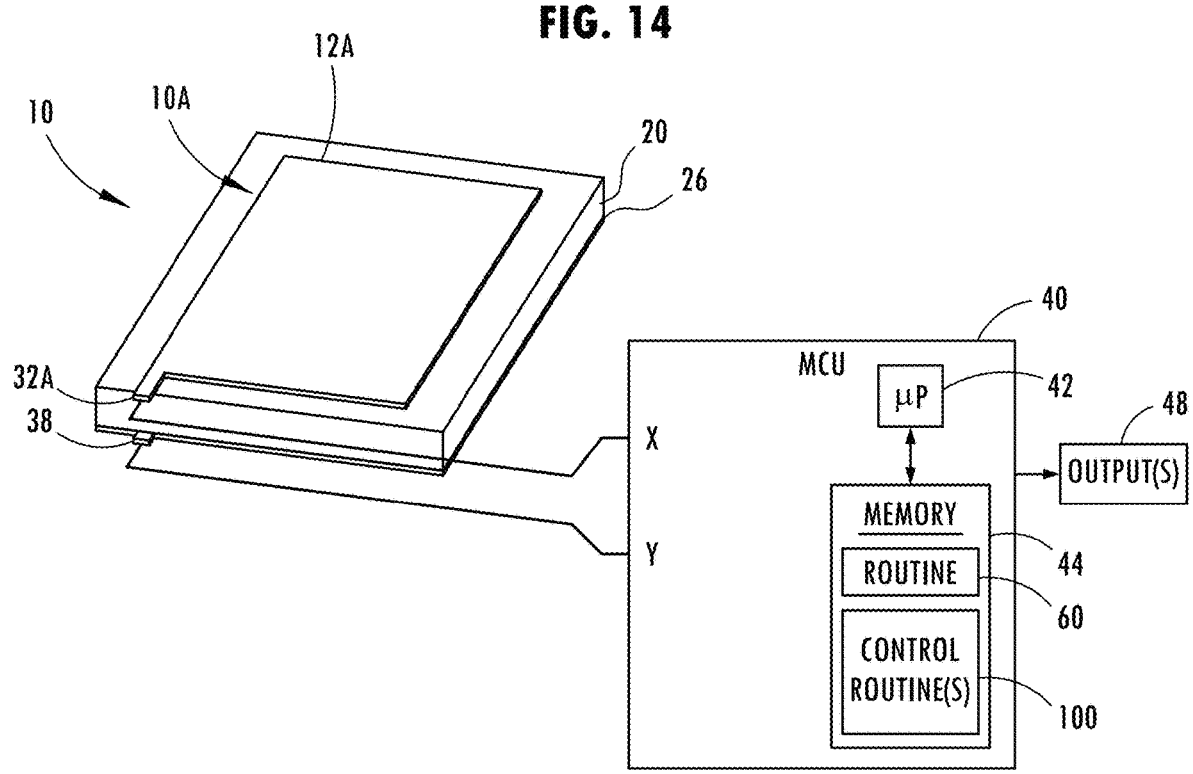
FIG. 15 is a front perspective view of the single sensor portion of the capacitive proximity sensor assembly shown in FIG. 13 and controlled by a controller to sample signals in a second sensor mode.

Referring to FIGS. 14-15, a capacitive sensor of the capacitive proximity sensor assembly 10 is further illustrated, according to the third embodiment shown in FIG. 3B. In this embodiment, a first electrode 12A having a signal terminal 32A is dielectrically isolated and spaced from a second electrode 26 having a signal terminal 38 via a compliant dielectric layer 20. The compliant dielectric layer 20 may include a soft compliant layer such as foam, according to one example. The first and second electrodes 12A and 26 may each comprise a sheet of conductive material, such as a printed ink that may be printed on the top and bottom sides of the compliant layer 20. The capacitive sensor assembly 10A may further include a dielectric front layer 30 and a dielectric bottom layer 28 to dielectrically isolate the sensor and protect the conductive electrodes.

Each capacitive sensor 10A may be configured to operate in a first self-capacitance sensor mode to provide a first sensor as shown in FIG. 14 in which the first electrode 12A is applied with a self-capacitance input signal. The controller subsequently senses an output signal to operate as a self-capacitance sensor and the second electrode 38 is driven to a voltage to operate as a shield. In this embodiment, proximity of an object such as a user's foot above the top front surface may be detected with self-capacitance sensing.

Each capacitive sensor 10A may be configured to operate in a second mutual capacitance sensor mode to provide a second sensor as shown in FIG. 15. In this sensor mode, the first electrode 12A operates with the drive signal X and the second electrode 26 operates with the receive signal Y. As such, pressure or force applied to the front surface of the front cover 30 of the capacitive proximity sensor assembly 10A may be sensed as the compliant layer 20 squeezes due to the force or pressure so that at least a portion of electrode 12A moves toward electrode 26.

The capacitive proximity sensor assembly 10 shown and described in the various embodiments may be useful for sensing proximity such as a touch or a gesture performed with one or more feet on or proximate to the front surface of sensor assembly, and proximity of an object proximate the assembly, and pressure or force applied to the front surface of the assembly in various applications including applications on vehicle floor assemblies. The input commands sensed by the sensor assembly may be used to control various vehicle functions. It should be appreciated that one or more of the capacitive sensor assembly 10 may be employed on other vehicle surfaces and may be employed on floor assemblies and elsewhere in non-vehicle applications.

Accordingly, it should be appreciated that the capacitive proximity sensor assembly may be employed onboard a vehicle, such as on a vehicle floor assembly to control command inputs to the vehicle. However, it should be appreciated that the capacitive proximity sensor assembly 10 may be employed on various other applications, according to other embodiments. The capacitive proximity sensor assembly 10 advantageously allows for sensing in various sensor arrangements that sequentially change rapidly due to signal control and sampling by the microprocessor in the controller so as to detect various sensed inputs with sensors that employ shared electrodes.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A vehicle floor assembly comprising:
a floor;
a capacitive proximity sensor assembly provided on the floor or on a floor cover for sensing one or more feet of a user, wherein the capacitive proximity sensor comprises:
a first electrode;
a second electrode; and
a compliant dielectric layer disposed between the first and second electrodes; and
a controller for controlling one or more vehicle related operations based on a user input sensed with the capacitive proximity sensor assembly, wherein the controller processes signals associated with the first and second electrodes and selectively reconfigures operation of the first and second electrodes in different proximity sensor arrangements to provide a first capacitive sensor configured to sense touch and a second capacitive sensor configured to sense pressure.

2. The vehicle floor assembly of claim 1, wherein the capacitive proximity sensor assembly is configured to detect a user touch command and a user pressure command, and wherein the controller controls the one or more vehicle related operations based on at least one of the user touch command and user pressure command.

3. The vehicle floor assembly of claim 1, wherein the floor cover comprises a floor mat configured to be located on the floor of a vehicle, and wherein the capacitive proximity sensor assembly is located on the floor mat.

4. The vehicle floor assembly of claim 1, wherein the capacitive proximity sensor assembly comprises a plurality of capacitive proximity sensors located in an array.

5. The vehicle floor assembly of claim 4, wherein the array of capacitive proximity sensors are configured to detect a gesture movement command.

6. The vehicle floor assembly of claim 1, wherein the capacitive proximity sensor assembly comprises a first capacitive proximity sensor and a second capacitive proximity sensor, wherein the first and second proximity sensors are located proximate one another.

7. The vehicle floor assembly of claim 1, wherein the first electrode comprises a pair of electrodes that are configurable to generate a mutual capacitance to provide a first capacitance sensor and are further configurable to generate a self-capacitance to provide a second capacitive sensor.

8. The vehicle floor assembly of claim 7, wherein the pair of electrodes comprises a first plurality of capacitive fingers and a second plurality of capacitive fingers, wherein the first plurality of capacitive fingers are interdigitated with the second plurality of capacitive fingers.

9. The vehicle floor assembly of claim 8, wherein the first and second electrodes provide a third capacitive sensor configured to sense proximity of an object.

10. The vehicle floor assembly of claim 9, wherein the controller sequentially samples signals associated with each of the first, second and third capacitive sensors.

11. A vehicle floor assembly comprising:
a floor;
a capacitive proximity sensor assembly provided on the floor or a floor cover for sensing one or more feet of a user and configured to detect a user touch input command and a user pressure input command, wherein the capacitive proximity sensor comprises:
a first electrode;
a second electrode; and
a compliant dielectric layer disposed between the first and second electrodes; and
a controller for receiving the user touch command and pressure command and controlling a vehicle related operation based on the detected input commands, wherein the controller processes signals associated with the first and second electrodes and selectively reconfigures operation of the first and second electrodes in different proximity sensor arrangements to provide a first capacitive sensor configured to sense touch and a second capacitive sensor configured to sense pressure.

12. The vehicle floor assembly of claim 11, wherein the floor cover comprises a floor mat configured to be located on the floor of a vehicle, and wherein the capacitive proximity sensor assembly is located on the floor mat.

13. The vehicle floor assembly of claim 11, wherein the capacitive proximity sensor assembly comprises a plurality of capacitive proximity sensors located in an array.

14. The vehicle floor assembly of claim 13, wherein the array of capacitive proximity sensors are configured to detect a gesture movement command.

15. The vehicle floor assembly of claim 11, wherein the capacitive proximity sensor assembly comprises a first capacitive proximity sensor and a second capacitive proximity sensor, wherein the first and second proximity sensors are located proximate one another.

16. The vehicle floor assembly of claim 11, wherein the first electrode comprises a pair of electrodes that are configurable to generate a mutual capacitance to provide a first capacitance sensor and are further configurable to generate a self-capacitance to provide a second capacitive sensor.

17. The vehicle floor assembly of claim 16, wherein the pair of electrodes comprises a first plurality of capacitive fingers and a second plurality of capacitive fingers, wherein the first plurality of capacitive fingers are interdigitated with the second plurality of capacitive fingers.

18. The vehicle floor assembly of claim 17, wherein the first and second electrodes further provide a third capacitive sensor configured to sense proximity of an object, and wherein the controller sequentially samples signals associated with each of the first, second and third capacitive sensors.

* * * * *